US009773965B2

(12) United States Patent
Park et al.

(10) Patent No.: US 9,773,965 B2
(45) Date of Patent: Sep. 26, 2017

(54) PIEZOELECTRIC VIBRATING DEVICE

(71) Applicant: INNOCHIPS TECHNOLOGY CO., LTD., Ansan-Si, Gyeonggi-Do (KR)

(72) Inventors: In Kil Park, Seongnam-Si (KR); Tae Hyung Noh, Siheung-Si (KR); Seong Cheol Park, Ansan-Si (KR); Young Sul Kim, Incheon (KR); Byung Yul Choi, Incheon (KR); Hyun Chul Jung, Siheung-Si (KR); Soon Dong Choi, Siheung-Si (KR)

(73) Assignee: INNOCHIPS TECHNOLOGY CO., LTD. (KR)

( * ) Notice: Subject to any disclaimer, the term of this patent is extended or adjusted under 35 U.S.C. 154(b) by 608 days.

(21) Appl. No.: 14/281,836

(22) Filed: May 19, 2014

(65) Prior Publication Data

US 2014/0339958 A1 Nov. 20, 2014

(30) Foreign Application Priority Data

May 20, 2013 (KR) ........................ 10-2013-0056185

(51) Int. Cl.
*H01L 41/053* (2006.01)
*H01L 41/09* (2006.01)

(52) U.S. Cl.
CPC ...... *H01L 41/0533* (2013.01); *H01L 41/0933* (2013.01)

(58) Field of Classification Search
CPC ....... B06B 1/0603; B06B 1/14; H01L 41/053; H01L 41/0933; G06F 3/016; G01F 3/041
USPC ........................................ 310/328, 340, 348
See application file for complete search history.

(56) References Cited

U.S. PATENT DOCUMENTS

| 5,780,958 | A  | * | 7/1998  | Strugach   | G10K 9/122 |
|           |    |   |         |            | 310/330    |
| 8,190,443 | B1 |   | 5/2012  | Ouzounian  |            |
| 8,305,845 | B2 |   | 11/2012 | Kamata     |            |
| 2012/0212100 | A1 |   | 8/2012  | Lee     |            |
| 2013/0300255 | A1 | * | 11/2013 | Yun     | H03H 9/09  |
|           |    |   |         |            | 310/323.01 |

(Continued)

FOREIGN PATENT DOCUMENTS

| CN | 102045037 A |   | 5/2011  |          |
|----|-------------|---|---------|----------|
| CN | 202276324 U |   | 6/2012  |          |
| CN | 202276324   | * | 6/2013  | H03N 9/15|

(Continued)

OTHER PUBLICATIONS

Borinski, Jason W., et al., "Fiber Optic Sensors for Predictive Health Monitoring," in Autotestcon Proceedings, 2001, IEEE Systems Readiness Technology Conference, 2001, pp. 250-262.

(Continued)

*Primary Examiner* — Thomas Dougherty
(74) *Attorney, Agent, or Firm* — Renaissance IP Law Group LLP

(57) ABSTRACT

Provided is a piezoelectric vibrating device including a case provided with a certain space therein, a piezoelectric vibrating member provided in the case and vibrating according to an applied voltage, a weight member provided in the case and connected to a part of the piezoelectric vibrating member in a vibration direction of the piezoelectric vibrating member, and a limitation member for limiting movement of the weight member.

10 Claims, 6 Drawing Sheets

(56) References Cited

U.S. PATENT DOCUMENTS

2015/0295520 A1* 10/2015 Hasegawa .............. H02N 2/188
　　　　　　　　　　　　　　　　　　　　　　310/323.01

FOREIGN PATENT DOCUMENTS

| JP | 9225401 | 9/1997 |
| JP | 10210766 | 8/1998 |
| KR | 100502782 | 7/2005 |
| KR | 100777630 | 11/2007 |
| KR | 20110045486 A | 5/2011 |
| KR | 20110113303 A | 10/2011 |
| KR | 101124797 | 3/2012 |

OTHER PUBLICATIONS

Grattan, S.K.T., et al., "Structural Health Monitoring—better solutions using fiber optic sensors?," in Sensors, 2009 IEEE, Oct. 25-28, 2009, pp. 811-814.

Laine, J. et al., "Benefits of MEMS Based Seismic Accelerometers for Oil Exploration," in Solid-State Sensors, Actuators and Microsystems Conference, 2007, Transducers 2007, International, Jun. 10-14, 2007, pp. 1473-1477.

Levinzon, Felix A., "Ultra-Low-Noise Seismic Piezoelectric Accelerometer With Integral FET Amplifier," in Sensors Journal, IEEE, vol. 12, No. 6, Jun. 2012, pp. 2262-2268.

Idogaki, Takaharu et al., "Characteristics of Piezoelectric Locomotive Mechanism for an In-Pipe MIcro Inspection Machine," 1995 IEEE, Micro Machine and Human Science, 1995, MHS '95., Proceedings of the Sixth International Symposium on Micro Machine and Human Science, Oct. 4-6, 1995, pp. 193-198.

* cited by examiner

FIG. 5
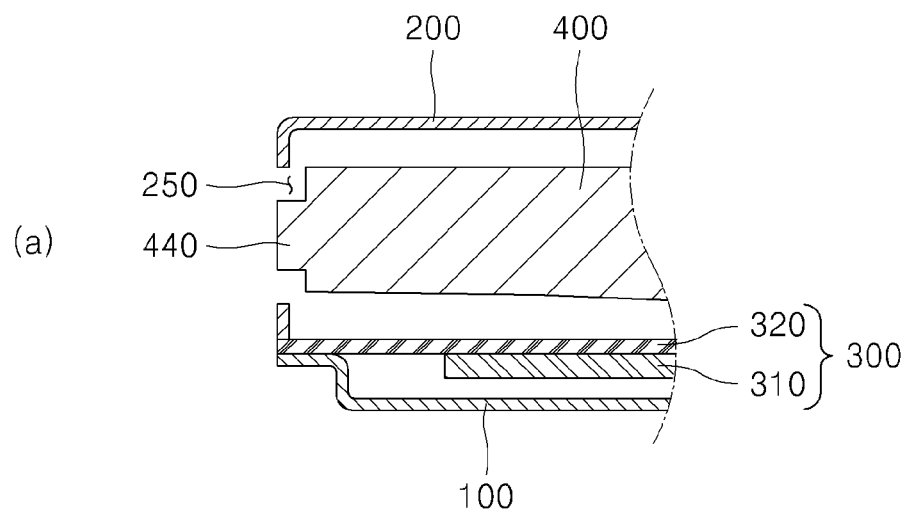
(a)
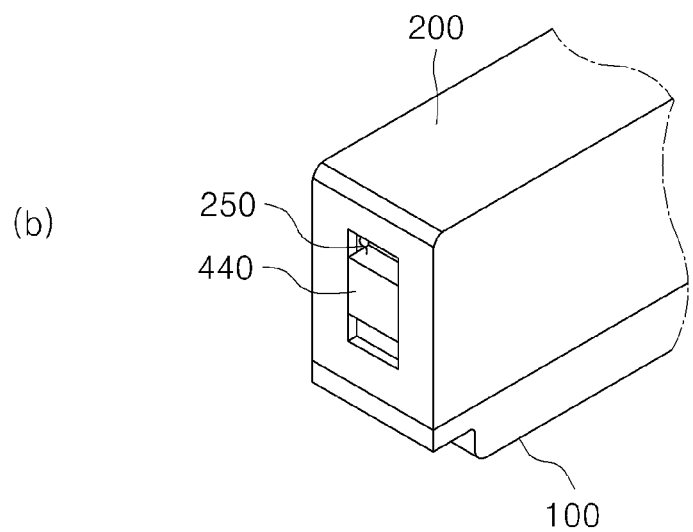
(b)

FIG. 6
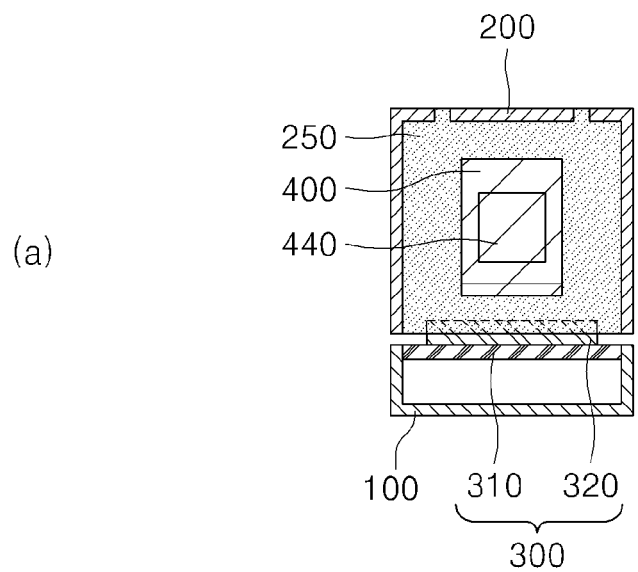
(a)
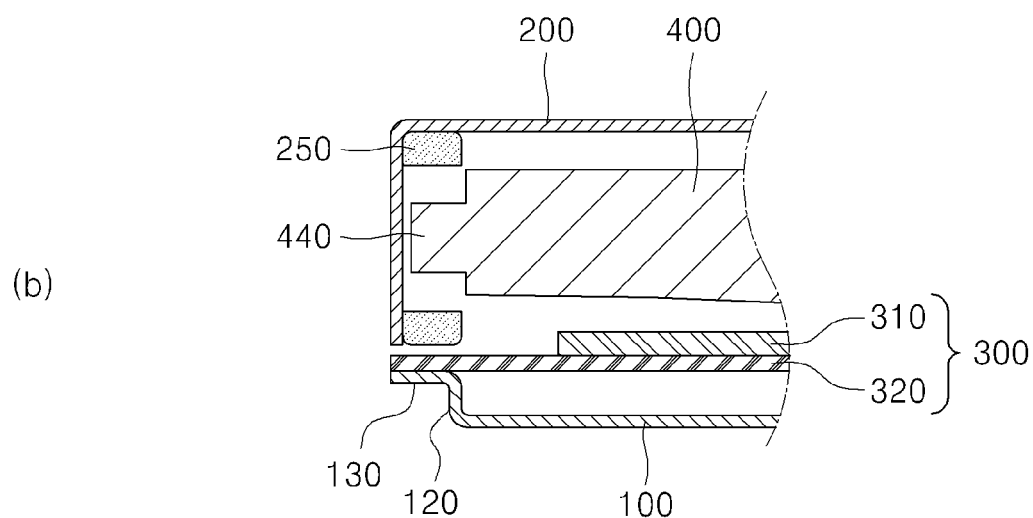
(b)

PIEZOELECTRIC VIBRATING DEVICE

CROSS-REFERENCE TO RELATED APPLICATION

This application claims priority to Korean Patent Application No. 10-2013-0056185 filed on May 20, 2013 and all the benefits accruing therefrom under 35 U.S.C. §119, the contents of which are incorporated by reference in their entirety.

BACKGROUND

The present disclosure relates to a vibrating device, and more particularly, to a piezoelectric vibrating device used in an electronic apparatus as a haptic feedback unit.

When pressure is applied to a piezoelectric material, a voltage occurs, which is a piezoelectric effect. When a voltage is applied thereto, an increase or decrease in a volume or length occurs due to a change in pressure in the piezoelectric material, which is an inverse piezoelectric effect. Piezoelectric vibrating devices use the inverse piezoelectric effect and generally applied to various electronic apparatuses such as cellular phones, portable multimedia players (PMP), and game consoles.

Piezoelectric vibrating devices used in cellular phones may be used as haptic feedback units responding to a touch of a user through vibrations. Haptic feedback designates a haptic sense capable of sensing by a finger tip or a stylus pen of a user when touching an object. Most desirable haptic feedback units are capable of replaying dynamic properties such as vibrations, touches, and an operation sound transferred to a finger when pushing a button as a response like touching a real button when a human touches a virtual object, for example, a button on a window screen. Accordingly, as an example of a piezoelectric vibrating device, Korean Patent Registration No. 10-0502782 (referred to as a cited invention 1) discloses a piezoelectric vibrating device attached with a plurality of piezoelectric element layers on one side or both sides of a vibrating plate. However, it is difficult to generate a full vibrating force necessary for an electronic apparatus by using a structure, in which piezoelectric elements are attached to the vibrating plate as disclosed in the cited invention 1. That is, amplitude of vibration is too small and the vibrating force is significantly smaller than a vibrating force generated by a coil type vibration motor using an electromagnetic theory or a solenoid type vibration apparatus currently used in cellular phones, thereby having no practicality.

To increase a vibrating force, Korean Patent Publication Application No. 2011-0045486 (hereinafter, referred to as a cited invention 2) discloses a piezoelectric vibrating device including a piezoelectric vibrating member generating vibrations, a weight vertically coupled with the piezoelectric vibrating member using a coupling member and amplifying a vibrating force, an a vibration supporting member fixing sides of the piezoelectric vibrating member. The piezoelectric vibrating device described above, for example, is provided in one area of a cellular phone and vibrates vertically to the cellular phone, thereby providing vibrations to the entire cellular phone.

However, the piezoelectric vibrating device of the cited invention 2 using the weight having great mass may be damaged at the piezoelectric vibrating member by impact. That is, while the weight is amplifying the vibrating force by vibrating within a preset range, when impact is given to the piezoelectric vibrating device due to a drop of the cellular phone, the weight moves more than the preset range. When the weight moves more than the preset range, impact is given to the piezoelectric vibrating member due to the mass of the weight, thereby damaging the piezoelectric vibrating member. As described above, when the piezoelectric vibrating member is damaged, since a haptic feedback does not occur, the piezoelectric vibrating device is driven to lose a function thereof.

SUMMARY

The present disclosure provides a piezoelectric vibrating device capable of preventing a piezoelectric vibrating member from being damaged by impact occurring due to a weight member.

The present disclosure also provides a piezoelectric vibrating device capable of preventing a piezoelectric vibrating member from being damaged by impact occurring due to excessive movement of a weight member by limiting a vibration range of the weight member.

In accordance with an exemplary embodiment, a piezoelectric vibrating device includes a case provided with a certain space therein, a piezoelectric vibrating member provided in the case and vibrating according to an applied voltage, a weight member provided in the case and connected to a part of the piezoelectric vibrating member in a vibration direction of the piezoelectric vibrating member, and a limitation member for limiting movement of the weight member.

The piezoelectric vibrating member may include a piezoelectric element and a vibrating plate and the piezoelectric element may be fixed to one of a top and a bottom of the vibrating plate.

The vibrating plate may be provided to be flat, to be bent at least once at an edge, or to be formed with a wrinkle at the edge.

A contact portion, in which the weight member and the piezoelectric vibrating member are in contact with each other, may be formed to be less 10% from a central portion of the weight member toward an outside.

The case, the piezoelectric vibrating member, and the weight member may be formed with holes at certain areas, respectively, and the limitation member may be inserted through the holes.

The limitation member may include a first area inserted into the hole of the weight member and the hole of an upper case and a second area inserted into the hole of the piezoelectric vibrating member and the hole of a lower case and the second area may be thicker than the first area.

The weight member and the piezoelectric vibrating member may not be in contact with the limitation member and the lower and upper cases may be in contact with the limitation member.

A part of the second area of the limitation member may be provided between the weight member and the piezoelectric vibrating member and may limit the movement of the weight member.

The limitation member may be provided by forming at least one area of the case below the piezoelectric vibrating member to have a height between the piezoelectric vibrating member and the weight member.

The case may include a plane opposite to the piezoelectric vibrating member, sides extending from edges of the plane toward the piezoelectric vibrating member, and a horizontal portion extending from two sides opposite to each other in a direction opposite to the plane, and the two sides connected to the horizontal portion may be formed to have a height between the piezoelectric vibrating member and the weight member.

The case may include a plane opposite to the piezoelectric vibrating member, sides extending from edges of the plane toward the piezoelectric vibrating member, and a horizontal portion extending from two sides opposite to each other in a direction opposite to the plane, and at least one area of the sides may be formed to have a height between the piezoelectric vibrating member and the weight member.

The limitation member may include projecting portions provided on two opposite sides of the weight member, respectively, and openings formed in sides of an upper case corresponding to the projecting portions to allow the projecting portions to be inserted therein, respectively.

The limitation member may include projecting portions provided on two opposite sides of the weight member, respectively, and guides formed on inner sides of an upper case corresponding to the projecting portions to allow the projecting portions to be inserted therein, respectively.

The piezoelectric vibrating member and the weight member may be in contact with each other in a horizontal direction and the limitation member may be provided between the piezoelectric vibrating member and the weight member while projecting from the case.

BRIEF DESCRIPTION OF THE DRAWINGS

Exemplary embodiments can be understood in more detail from the following description taken in conjunction with the accompanying drawings, in which:

FIGS. 4 to 7 are schematic diagrams of piezoelectric vibrating devices according to other embodiments.

DETAILED DESCRIPTION OF EMBODIMENTS

Figure 1:
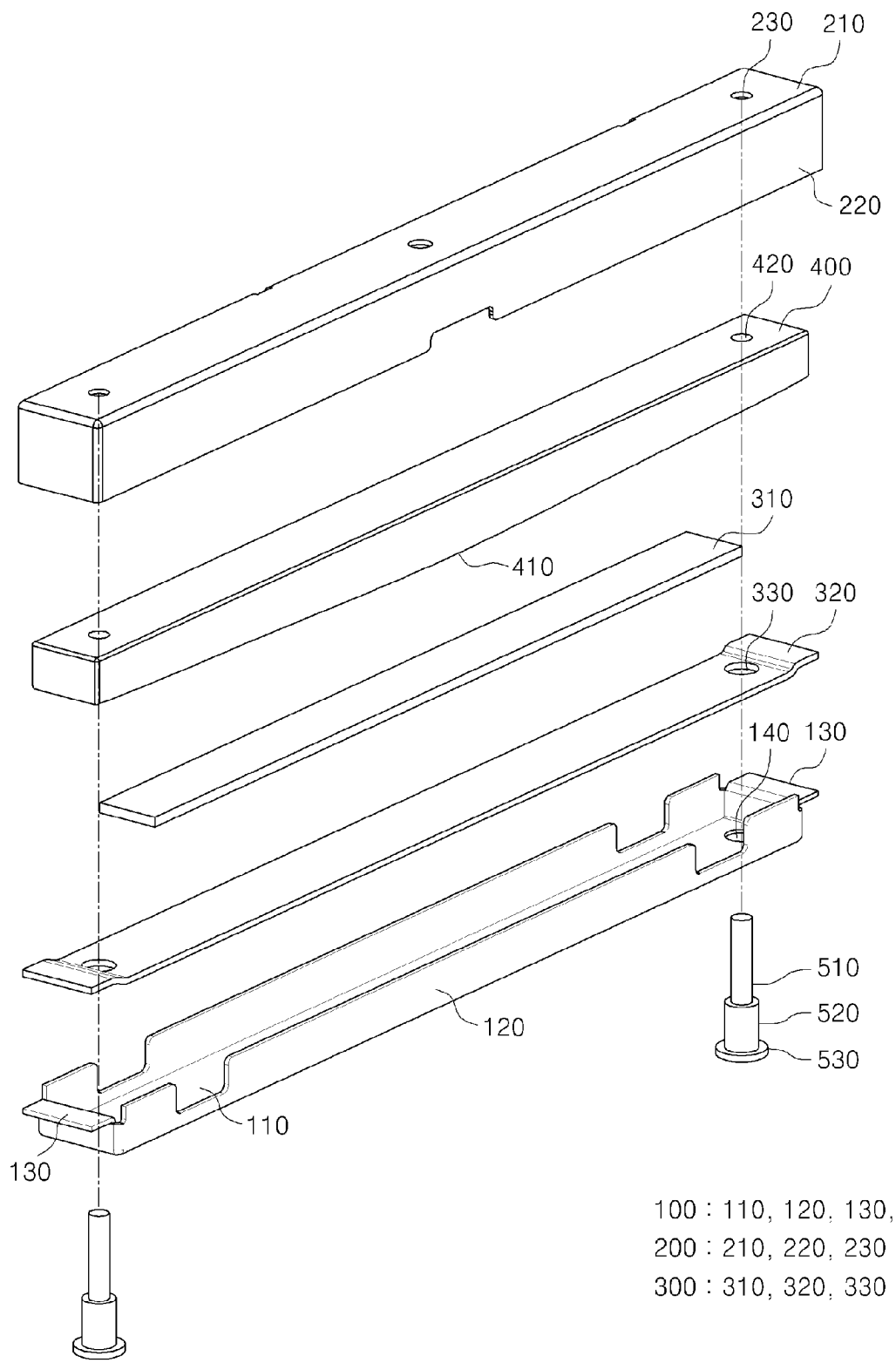
FIGS. 1 and 2 are an exploded view and a coupled perspective view of a piezoelectric vibrating device according to an embodiment.

Hereinafter, exemplary embodiments will be described in detail with reference to the accompanying drawings. The present disclosure may, however, be embodied in many different forms and should not be construed as being limited to the embodiments set forth herein; rather, these embodiments are provided so that this disclosure will be thorough and complete, and will fully convey the concept of the invention to those skilled in the art. Further, the present disclosure is only defined by scopes of claims.

Hereinafter, embodiments of the present invention will be described in detail with reference to the attached drawings. However, the present invention is not limited to the embodiments disclosed below but may be embodied as various different forms. Merely, the embodiments below are provided to fully disclose the present invention and to allow a person of ordinary skill in the art to consummately know the scope of the present invention. Throughout the drawings, like reference numerals refer to like elements.

Figure 2:
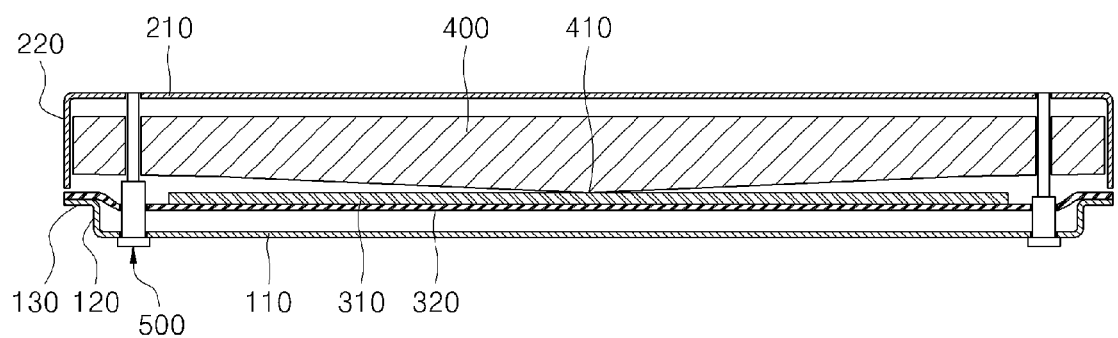
Figure 3:
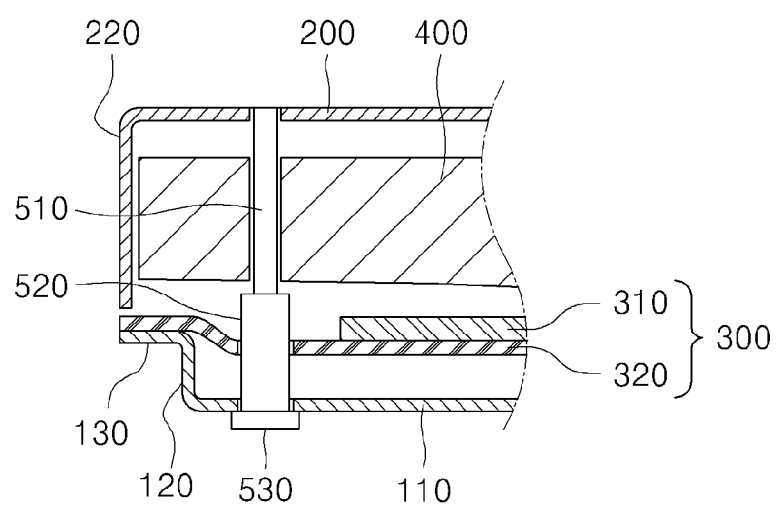
FIG. 3 is a partial cross-sectional view of the piezoelectric vibrating device of FIG. 1.

FIG. 1 is an exploded perspective view of a piezoelectric vibrating device according to an embodiment. FIG. 2 is a coupled cross-sectional view of the piezoelectric vibrating device of FIG. 1. FIG. 3 is a partial cross-sectional view of the piezoelectric vibrating device of FIG. 1.

Referring to FIGS. 1 to 3, the piezoelectric vibrating device includes lower and upper cases 100 and 200 coupled with each other to provide a certain space, a piezoelectric vibrating member 300 provided in an inner space between the lower and upper cases 100 and 200 and generating vibrations, a weight member 400 provided in the inner space between the lower and upper cases 100 and 200, coupled with a part of the piezoelectric vibrating member 300, and amplifying vibrations of the piezoelectric vibrating member 300, and a limitation member 500 provided penetrating the lower case 100, the piezoelectric vibration member 300, and the weight member 400 to limit a vibration range of the weight member 400.

The lower case 100 is provided on a bottom of the piezoelectric vibrating device and is coupled with the upper case 200, thereby providing the certain space therein and forming an external shape of the piezoelectric vibrating device. The lower case 100 is provided below the piezoelectric vibrating member 300 to allow at least a part of the piezoelectric vibrating member 300 to be contained in the inner space. The lower case 100 may have a shape with two long sides opposite to each other in a longitudinal direction and two short sides opposite to each other in a lateral direction intersecting the longitudinal direction to provide the inner space along shapes of the piezoelectric vibrating member 300 and the weight member 400. That is, two sides corresponding to a length of the weight member 400 may be long and two sides corresponding to a width of the weight member 400 may be short. The lower case 100 may include a plane 110 and four sides 120 extending upwards from corners of the plane 110. The plane 110 may be separate from the piezoelectric vibrating member 300 and may cover a bottom of the piezoelectric vibrating member 300. The sides 120 may extend upwards from all area of edges of the plane 110 and may extend upwards from at least a part of the edges. That is, the sides 120 may partially extend from the edges of the plane 110. Also, the sides 120 may have the height in all area or may have mutually different heights from at least two areas. As described above, although having various shapes, the sides 120 may be coupled with the upper case 200 to be covered. On the other hand, a horizontal portion 130 extending outwards opposite to the plane 110 may be further formed on a top of the side 120 formed from an edge of a short side of the plane 110. That is, the plane 110 of the lower case 100 may be shorter than the length of the weight member 400 and the horizontal portion 130 may be formed to be identical to or longer than the length of the weight member 400 outwards from the sides 120 extending upwards from the edges of the short sides of the plane 110. In other words, a sum of lengths of the plane 110 and the horizontal portions 130 may be the length of the weight member 400. The horizontal portion 130 may be provided with a part of the piezoelectric vibrating member 300 on a top thereof, for example, with an end of a vibrating plate 320. Also, a hole 140 inserted with the limitation member 500 is formed in a certain area of the lower case 100, that is, on an outside of the plane 110. The hole 140 may formed to have a diameter identical to a thickness of one area of the limitation member 500 to be in contact with the one area of the limitation member 500. For example, a thickness of the limitation member 500 may be differently formed in at least two areas in a longitudinal direction and a thicker area is inserted into the hole 140, thereby being in contact with and fixed to the hole 140.

The upper case 200 is coupled with the lower case 100, thereby providing a certain space therein. The upper case 200 is provided on a top of the weight member 400 and the weight member 400 is contained therein and at least a part of the piezoelectric vibrating member 300 is contained. That is, the weight member 200 may be provided in the upper case 200, and the piezoelectric vibrating member 300 may be provided in the space between the lower and upper cases 100 and 200. The upper case 200 may have a shape with two long sides opposite to each other in a longitudinal direction and two short sides opposite to each other in a lateral direction intersecting the longitudinal direction to provide an inner space along shapes of the piezoelectric vibrating member 300 and the weight member 400. That is, the upper case 200 may include a plane 210 and four sides 220 extending toward the lower case 100 from edges of the plane 210. The plane 210 may have two long sides along the longitudinal direction of the weight member 400 and two short sides along the lateral direction of the weight member 400. Also, the sides 220 of the upper case 200 may extend downwards from all area of the edges of the plane 210 and may extend downwards from at least a part of the edges. That is, the sides 220 may partially extend from the edges of the plane 210. Herein, the sides 220 of the upper case 200 may surround the outside of the sides 120 of the lower case 100. That is, the piezoelectric vibrating member 300 and the weight member 400 may be contained therein and the sides 220 of the upper case 200 and the sides 120 of the lower case 100 may be couple with one another, thereby providing the piezoelectric vibrating device. Also, the upper case 200 may be manufactured to allow the sides 220 to have a length, a height, and a width greater than the weight member 400 to contain the weight member 400 therein. That is, the upper case 200 may be provided to allow the weight member 400 to be separate from the plane 210 and the sides 220 of the upper case 200 in the inner space of the upper case 200. Also, a hole 230 inserted with the limitation member 500 is formed in a certain area of the upper case 200, that is, on an outside of the plane 210. The hole 230 may formed to have a diameter identical to a thickness of another area of the limitation member 500 to be in contact with the other area of the limitation member 500. For example, the thickness of the limitation member 500 may be differently formed in at least two areas in the longitudinal direction and a thinner area is inserted into the hole 230, thereby being in contact with and fixed to the hole 230. That is, the thicker area of the limitation member 500 may be inserted into and fixed to the hole 140 of the lower case 100 and the thinner area may be inserted into and fixed to the hole 230 of the upper case 200. Accordingly, the hole 230 of the upper case 200 may be formed to be smaller than the hole 140 of the lower case 100.

The piezoelectric vibrating member 300 includes a piezoelectric element 310 and the vibrating plate 320 attached to at least one side of the piezoelectric element 310, thereby generating vibration using an inverse piezoelectric effect of generating bending stress according to applying voltage. That is, the piezoelectric element 310 expands in a longitudinal direction thereof according to applied voltage, for example, toward the horizontal portion 130 of the lower case 100 and the vibrating plate 320 deforms the expanding into bending deformation and generates vibrations. The piezoelectric element 310 includes a substrate and a piezoelectric layer formed with the substrate on at least one side thereof. For example, the piezoelectric element 310 may be formed as a bimorph piezoelectric element formed with piezoelectric layers on both sides of a substrate or may be formed as a unimorph piezoelectric element formed with a piezoelectric layer on one side of a substrate. The piezoelectric layer may be formed by laminating at least one layer and more particularly may be formed by laminating a plurality of piezoelectric layers. Also, on a top and a bottom of the piezoelectric layer, electrode layers may be formed, respectively. However, to increase displacement and a vibrating force and to allow driving at low voltage, a plurality of piezoelectric layers may be laminated as a unimorph piezoelectric element. Herein, the piezoelectric layer, for example, may be formed using one of piezoelectric materials based on Pb, Zr, and Ti (PZT), Na, K, and Nb (NKN), and Bi, Na, and Ti (BNT). Also, the substrate may be formed using a material having properties capable of keeping a structure laminated with piezoelectric layers and generating vibrations, for example, may use metal or plastic. On the other hand, an electrode terminal applied with a driving voltage may be provided on at least one end of the substrate. The piezoelectric element 310 is adhered to at least one side of the vibrating plate 320 using adhesives. Herein, to allow both sides of the vibrating plate 320 to remain as the same length, the piezoelectric element 310 may be adhered to a central portion of the vibrating plate 320. Also, the piezoelectric element 310 may be adhered to a top surface of the vibrating plate 320 or to a bottom surface of the vibrating plate 320 or may be adhered to both the top and bottom surfaces of the vibrating plate 320. That is, in the embodiment, the piezoelectric element 310 is adhered to the top surface of the vibrating plate 320. However, the piezoelectric element 310 may be adhered to the bottom surface of the vibrating plate 320 or may be adhered to both the top and bottom surfaces of the vibrating plate 320. Herein the piezoelectric element 310 and the vibrating plate 320 may be fixed using various methods in addition to adhesion. For example, the vibrating plate 320 and the piezoelectric element 310 may be stuck to each other using a sticking agent and then the sides of the vibrating plate 320 and the piezoelectric element 310 are adhered using adhesives, thereby being fixed. On the other hand, the vibrating plate 320 may be manufactured using metal or plastic or may have at least dual structure by laminating mutually different materials. The piezoelectric element 310 and the vibrating plate 320 are manufactured to have an approximate rectangular plate shape. That is, the piezoelectric element 310 and the vibrating plate 320 are manufactured to have certain lengths, widths, and thicknesses, respectively, and to have one side and another side opposite to each other. Herein, the vibrating plate 320 may be manufactured to be longer than the piezoelectric element 310. Also, the vibrating plate 320 may be manufactured to have the same length as the weight member 400. In the piezoelectric vibrating member 300, the one side of the vibrating plate 320 is adhered to the one side of the piezoelectric element 310 and the other side of the vibrating plate 320 is coupled with a part of the weight member 400. That is, the piezoelectric element 310 may be adhered to the bottom surface of the vibrating plate 320 and the part of the weight member 400 may be coupled with the top surface of the vibrating plate 320. Also, when the piezoelectric element 310 is adhered to the top surface of the vibrating plate 320, the piezoelectric element 310 and the weight member 400 may be coupled with each other. Herein, the piezoelectric vibrating member 300 and the weight member 400 may be coupled with each other through adhesion. Also, the vibrating plate 320 may be formed to allow a certain area excluding an area adhered to the piezoelectric element 310 to be bent. That is, as shown in FIG. 2, the vibrating plate 320 outside the area adhered to the piezoelectric element 310 may have a curve, for example, may have a shape bent downwards and then bent upwards. Also, the vibrating plate 320 is formed to be flat outside the curve and the flat area may be in contact with a top of the horizontal portion 130 of the lower case 100. In other words, the vibrating plate 320 may have a first area in contact with the piezoelectric element 310 and a second area in contact with the horizontal portion 130 of the lower case 100, which have a flat plate shape, and an indented third area between the first and second areas. However, the vibrating plate 320 may be manufactured to allow all areas to have the same shape in all areas, that is, may be manufactured as a plate shape. That is, the vibrating plate 320 may be manufactured as a flat plate and the edges thereof may be in contact with the horizontal portion 130. On the other hand, in one area of the piezoelectric vibrating member 300, a hole 330 inserted with the limitation member 500 is formed. The hole 330 may be formed in one area of the vibrating plate 320, which is not formed with the piezoelectric element 310. For example, the hole 330 may be formed penetrating the indented third area of the vibrating plate 320. Herein, since vibrations of the vibrating plate 320 may be restrained when the hole 330 is in contact with the limitation member 500, the hole 330 may be formed to be greater than a thickness of the limitation member 500. Also, the hole 140 of the lower case 100 and the hole 330 of the piezoelectric vibrating member 300 are inserted with the thicker area of the limitation member 500. Since the limitation member 500 is inserted into and fixed to the hole 140 of the lower case 100 and is inserted into the hole 330 of the piezoelectric vibrating member 300 while being separate therefrom, the hole 330 of the piezoelectric vibrating member 300 is formed to be greater than the hole 140 of the lower case 100. According to a shape of the limitation member 500, the hole 330 of the piezoelectric vibrating member 300 may be smaller than the hole 140 of the lower case 100. However, the hole 330 of the piezoelectric vibrating member 300 is separate from the limitation member 500 and the hole 140 of the lower case 100 is in contact with the limitation member 500.

The weight member 400 has an approximate hexahedral shape having a certain length, width, and thickness. Herein, two sides opposite to each other in a lateral direction may be broader than two sides opposite to each other in a thickness direction. Also, the weight member 400 is formed with a contact portion 410 toward the piezoelectric vibrating member 300 and the contact portion 410 is in contact with the piezoelectric vibrating member 300. That is, the contact portion 410 may be provided in a central portion of one side of the weight member 400 in the thickness direction, opposite to one side of the piezoelectric vibrating member 300, thereby being in contact with the central portion of the piezoelectric vibrating member 300. Herein, the one side of the weight member 400 provided with the contact portion 410 may be provided horizontally and the contact portion 410 may be provided projecting from a central portion thereof. The one side of the weight member 400 may be formed to be bent from an edge to the central portion with a certain angle, and a highest point of the central portion may become the contact portion 410 and may be contact with the piezoelectric vibrating member 300. Herein, the contact portion 410 and the piezoelectric vibrating member 300 may be adhered to each other using adhesives, etc. to be fixed to each other. Accordingly, the contact portion 410 is in contact with the piezoelectric vibrating member 300 and other areas of the weight member 400 may be separate from the piezoelectric vibrating member 300. However, according to a kind and properties of adhesives, it may be necessary to apply the adhesives thick. According to a thickness of the applied adhesives, an interval between the piezoelectric vibrating member 300 and the weight member 400 increases, thereby increasing a thickness of the piezoelectric vibrating device. Accordingly, an area applied with the adhesives, that is, the contact portion 410 may be formed with a dent concave inwards according to the thickness of the applied adhesives. On the other hand, the contact portion 410 may not be located in a central portion of the weight member 400 or may move less about 10% from the central portion. Accordingly, vibrating frequency and displacement may be controlled. As described above, the weight member 400 coupled with the piezoelectric vibrating member 300 vibrates together with the piezoelectric vibrating member 300 due to vibrations of the piezoelectric vibrating member 300 and loads a weight thereof to the vibrations. As described above, when the weight member 400 is coupled with the piezoelectric vibrating member 300 and the weight of the weight member 400 is loaded, a weight of a vibrating body is added, thereby more reducing resonant frequency but more reinforcing a vibrating force than when the piezoelectric vibrating member 300 vibrates alone. Particularly, at a certain frequency of an alternating current (AC) driving voltage, the vibrating force is amplified to the max. The resonant frequency may have different values according to physical finances and properties of respective components such as the piezoelectric vibrating member 300 and the weight member 400. The vibrating body generates greatest vibrations when vibrating at own frequency thereof. When the vibrating body is formed of the piezoelectric vibrating member 300 alone without the weight member 400, since a resonance point of the vibrating body is similar to the own frequency of the piezoelectric element 310, a current flowing through the piezoelectric element 310 is relatively higher when the piezoelectric vibrating member 300 vibrates maximally at the resonance point. In comparison, when the vibrating body is formed of a combination of the piezoelectric vibrating member 300 and the weight member 400, the resonance point of the vibrating body is greatly far from the own frequency of the piezoelectric element 310. Accordingly, when the vibrating body generates maximum vibrations at the resonance point, the current flowing through the piezoelectric element 310 becomes relatively lower. Also, since the current flowing through the piezoelectric vibrating member 300 is lower at the latter than the former, when the weight member 400 is used for the vibrating body, a power consumption amount may be largely reduced. On the other hand, the weight member 400 is formed with a hole 420 inserted with the limitation member 500 outside thereof. That is, the limitation member 500 is inserted into the hole 420 of the weight member 400 through from the hole 140 of the lower case 100 to the hole 330 of the piezoelectric vibrating plate 300. The hole 420 may be formed to be greater than the thickness of the limitation member 500 to be separate from the limitation member 500 with a certain interval. That is, although the weight member 400 amplifies the vibrations of the piezoelectric vibrating member 300, when the limitation member 500 is in contact with the weight member 400, the vibrations of the piezoelectric vibrating member 300 may not be amplified. However, the weight member 400 vibrates toward the lower and upper cases 100 and 200, that is, up and down. Herein, since the limitation member 500 penetrates the weight member 400 up and down and inner surface of the hole 420 is separate from the limitation member 500, the limitation member 500 does not obstruct vertical vibrations of the weight member 400. Since the thinner area of the limitation member 500 is inserted into the hole 420 of the weight member 400, the hole 420 of the weight member 400 is formed to be greater than the thinner area of the limitation member 500.

The limitation member 500 is inserted into at least one area of the piezoelectric vibrating device and limits movement of the weight member 400 out of a preset range. The limitation member 500 is provided as a certain pin shape and may be formed to allow at least two areas to have different diameters. That is, the limitation member 500, as shown in FIGS. 1 to 3, may include a first area 510 having a certain length and inserted into the hole 420 of the weight member 400 and the hole 230 of the upper case 200 to have a first thickness and a second area 520 having a certain length and inserted into the hole 330 of the piezoelectric vibrating member 300 and the hole 140 of the lower case 100 to have a second thickness, in which the first area 510 may be thinner than the second area 520. Also, the limitation member 500 may be provided with the first area 510 on a top of the second area 520 and a third area 530 greater than the second area 520 on a bottom of the second area 520. The third area 530 is in contact with an outside of the hole 140 of the lower case 100, that is, the outside of the plane 110 of the lower case 100 and prevents the limitation member 500 to be further inserted into the inside of the piezoelectric vibrating device. That is, the limitation member 500 is inserted from the first area 510 into the hole 140 of the lower case 100 to allow the third area 530 to be in contact with the outside of the lower case 100. Eventually, the limitation member 500 may be formed to allow the lengths of the first and second areas 510 and 520 to correspond to a height of the piezoelectric vibrating device. The limitation member 500 may limit a vibration range of the weight member 400 by controlling a ratio between the first area 510 and the second area 520. That is, the weight member 400 is allowed to vibrate within a preset range. However, the piezoelectric vibrating device may move more than the preset range due to external impact given by a drop of a cellular phone built with the piezoelectric vibrating device. Accordingly, the piezoelectric vibrating member 300 may be hit by the weight member 400 and then damaged. However, the second area 520 of the limitation member 500 may limit the movement of the weight member 400. In other words, the bottom of the weight member 400 and the top of the second area 520 of the limitation member 500 keep a certain interval therebetween, thereby setting the vibration range of the weight member 400. Therefore, an interval between the second area 520 and the weight member 400 is controlled, thereby setting the vibration range of the weight member 400.

As described above, in the piezoelectric vibrating device, the limitation member 500 is inserted through the lower case 100, the piezoelectric vibrating member 300, and the weight member 400 and one area of the limitation member 500 keeps an interval between the piezoelectric vibrating member 300 and the weight member 400 to allow the piezoelectric vibrating member 300 to move within a preset range. That is, the limitation member 500 may include the first area 510 and the second area 520 thicker than the first area 510. Herein, the first area 510 is inserted into the weight member 400 to be separate from the weight member 400 and a part of the second area 520 inserted into the piezoelectric vibrating member 300 is allowed to keep the interval between the weight member 400 and the piezoelectric vibrating member 300. Accordingly, although the weight member 400 moves more than the preset range due to external impact, since the movement of the weight member 400 may be limited by the second area 520 of the limitation member 500 between the weight member 400 and the piezoelectric vibrating member 300, a hit of the weight member 400 to the piezoelectric vibrating member 300 may be prevented, thereby preventing damages of the piezoelectric vibrating member 300.

Figure 4:
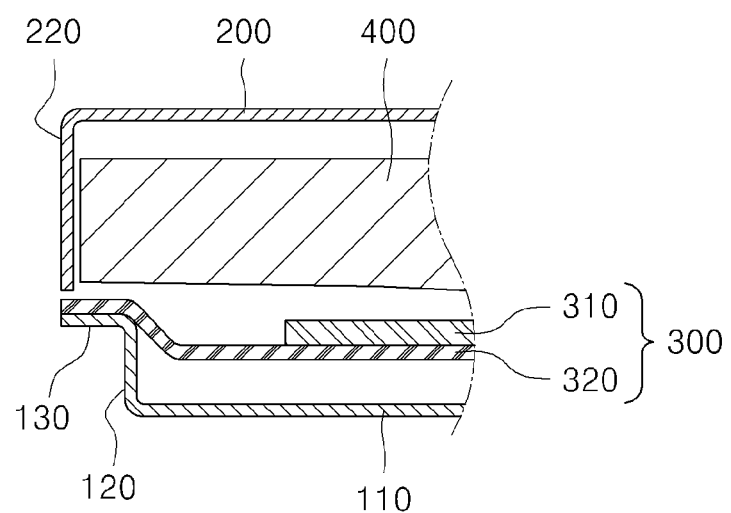

On the other hand, in the embodiment, the limitation member 500 having a pin shape with one area thicker than another area is inserted to limit the movement of the weight member 400. However, the movement of the weight member 400 may be limited by changing a structure of the piezoelectric vibrating device without using the limitation member 500 having the pin shape. For example, the movement of the weight member 400 may be limited by changing a structure of the lower case 100. That is, as shown in FIG. 4, a height of the horizontal portion 130 of the lower case 100 may be formed to be higher than a height of the piezoelectric vibrating member 300. That is, the vibrating plate 320 of the piezoelectric vibrating member 300 may include the first area in contact with the piezoelectric element 310 and the second area in contact with the horizontal portion 130 of the lower case 100, which have a flap plate shape, and the third area between the first and second areas, in which the third area is modified to slant from the first area toward the second area to allow the second area to be higher than the first area. Accordingly, the horizontal portion 130 of the lower case 100 in contact with the second area may also be formed to be higher than the piezoelectric vibrating member 300. The horizontal portion 130 and the third area of the vibrating plate 320 supported by the horizontal portion 130 may limit the movement of the weight member 400. Also, a certain area of the side 120 is allowed to more project than other areas to be used as a limitation member, thereby limiting the movement of the weight member 400. That is, the certain area of the long side 120 of the lower case 100, for example, at least a part of an area corresponding to the indented third area of the vibrating plate 320 may be formed to be higher than other areas and then the projecting side 120 is used as the limitation member, thereby limiting the movement of the weight member 400. Herein, a height of the projecting side 120 may be determined according to a preset movement range of the weight member 400. Eventually, in the embodiment, the movement of the weight member 400 may be limited by locally controlling the heights of the projecting area of the limitation member 500 inserted into the piezoelectric vibrating device and the side 120 of the lower case 100.

Also, in other embodiments, the shapes of the weight member 400 and the upper case 200 may be modified to be used as a limitation member for limiting the movement of the weight member 400, which will be described with reference to FIGS. 5A to 6B as follows. As shown in FIG. 5, projecting portions 440 having a smaller size than other areas of the weight member 400 are provided on two sides opposite to each other in the longitudinal direction of the weight member 400, respectively, and openings 250 are formed on areas of the upper case 200 corresponding to the projecting portions 440 to be greater than the projecting portions 440 to allow the projecting portions 440 to be inserted into the openings 240. That is, the projecting portions 440 formed on the sides of the weight member 400 are inserted into the openings 240 of the upper case 200 and function as a limitation member. Herein, the openings 240 are formed to be greater than the projecting portions 440 in such a way that the projecting portions 440 are inserted into the openings 240 with certain intervals while vertical intervals between the openings 240 and the projecting portions 440 keep the preset movement range of the weight member 400. Accordingly, when the projecting portions 440 vibrate in the openings 240 together with the vibration of the weight member 400 and excessive movement of the weight member 400 occurs, movement of the projecting portions 440 is limited by the openings 240, thereby preventing damages of the piezoelectric vibrating member 300 occurring due to the weight member 400. Also, as shown in FIGS. 6A and 6B, the projecting portion 440 is formed on the side of the weight member 400 and a guide 250 for limiting the movement of the projecting portion 440 may be formed in the upper case 200. That is, the guide 250 having a certain size is formed on an inner surface of the upper case 200 and the projecting portion 440 is inserted into the guide 250 while being separate therefrom. Herein, a vertical interval between the guide 250 and the projecting portion 440 keeps the preset movement range of the weight member 400. Accordingly, when the projecting portion 440 vibrates in the guide 250 together with the vibration of the weight member 400 and excessive movement of the weight member 400 occurs, movement of the projecting portion 440 is limited by the guide 250, thereby preventing damages of the piezoelectric vibrating member 300 occurring due to the weight member 400.

On the other hand, in the embodiments, it has been described to limit the movement of the weight member 400 of the piezoelectric vibrating device, in which the piezoelectric vibrating member 300 and the weight member 400 are vertically coupled with each other and the weight member 400 amplifies vibrations in a vertical direction. However, according to another embodiment, it is possible to limit the movement of the weight member 400 of the piezoelectric vibrating device, in which the piezoelectric vibrating member 300 and the weight member 400 are horizontally coupled with each other and the weight member 400 amplifies vibrations in a horizontal direction, which is shown in FIG. 7.

Figure 7:
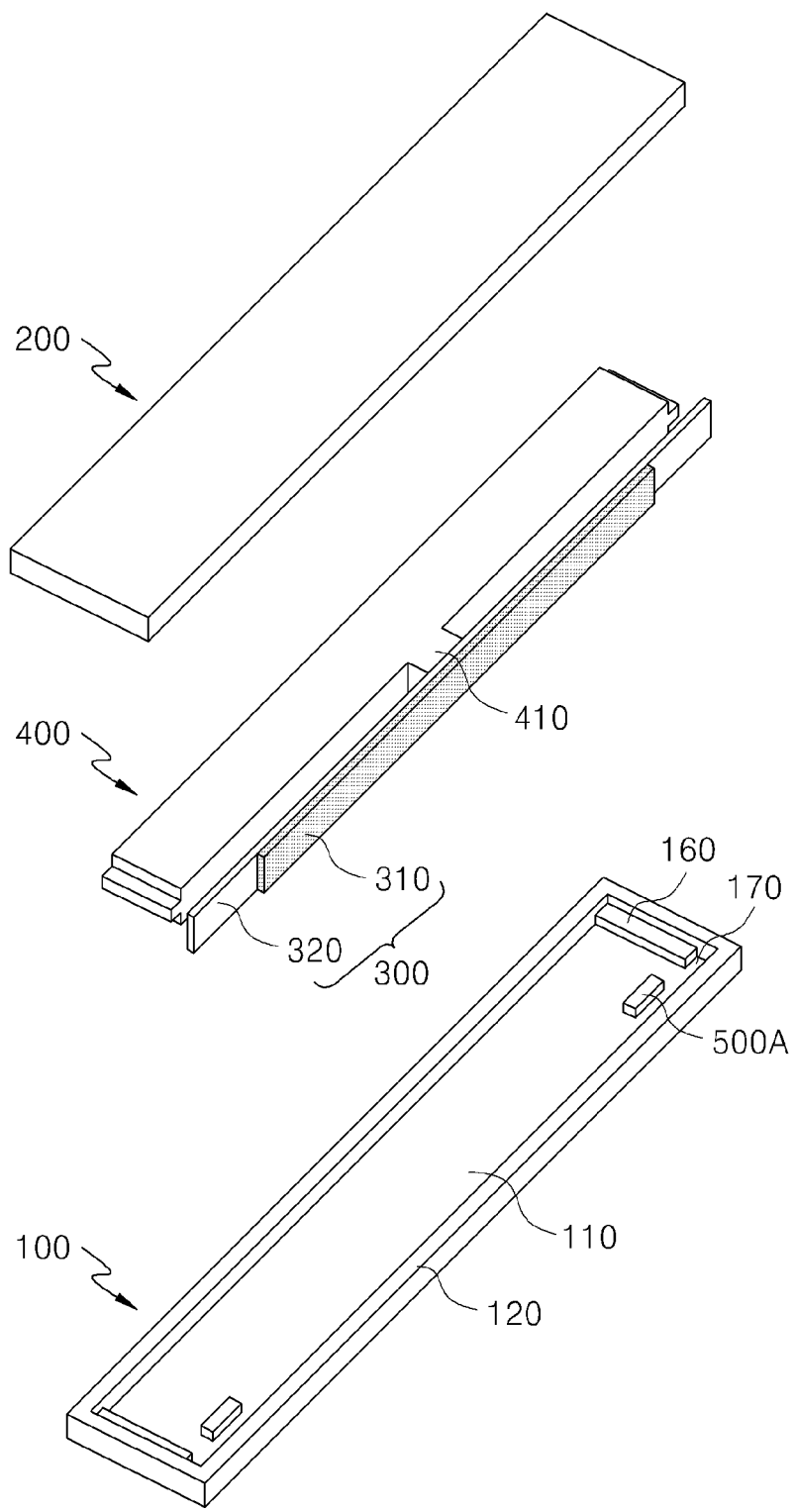

Referring to FIG. 7, the piezoelectric vibrating device includes the lower and upper cases 100 and 200 coupled with each other to provide a certain space, the piezoelectric vibrating member 300 provided between the lower and upper cases 100 and 200 and generating vibrations in a horizontal direction, the weight member 400 coupled with a part of the piezoelectric vibrating member 300 in a horizontal direction and amplifying the vibrations of the piezoelectric vibrating member 300, and a limitation member 500A provided between the weight member 400 and the piezoelectric vibrating member 300 and limiting movement of the weight member 400.

The lower and upper cases 100 and 200 are coupled with each other and provide the certain space therein, and the piezoelectric vibrating member 300 and the weight member 400 are provided in an inner space. Also, the lower and the upper cases 100 and 200 may have the same shape. Accordingly, only a structure of the lower case 100 will be described. The lower case 100, for example, may include a plane 110 and four sides 120 extending upwards from corners of the plane 110. Also, the lower case 100 may be provided to allow a ratio between a length and a width, for example, to be from about 2:1 to about 8:1. A height of the lower case 100 may be manufactured according to thicknesses of the piezoelectric vibrating member 300 and the weight member 400 to be capable of containing them. Also, a single step 160 having a certain width in a lateral direction is formed on both ends inside the lower case 100. That is, the single step 160 is formed between an inside of the sides 120 in the lateral direction and the plane 110 to be higher than the plane 110 and to be lower than the sides 120. Between single steps 160 of the lower and the upper cases 100 and 200, an end of the weight member 400 is inserted. Accordingly, an interval the single steps 160 of the lower and the upper cases 100 and 200 may be kept to allow the end of the weight member 400 to be inserted. Herein, the projecting portion 440 is provided on both ends of the weight member 400 and inserted between the single steps 160, thereby allowing the single steps 160 and the projecting portion 440 to keep a certain interval. The single step 160 is partially removed to form a certain groove 170 or is separate from at least one side 120 with a certain interval in a longitudinal direction to form the groove 170. The groove 170 is inserted with a part of the piezoelectric vibrating member 300, for example, the vibrating plate 320 and fixes the vibrating plate 320 to be in the lower and upper cases 100 and 200. Accordingly, the groove 170 may be formed to have a width as a thickness of the vibrating plate 320. Also, when the vibrating plate 320 is inserted into the groove 170, an interval for preventing the piezoelectric element 310 from being in contact with one side 120 of the lower and upper cases 100 and 200 is kept. Herein, when a width of the groove 170 is broader than the thickness of the vibrating plate 320, the vibrating plate 320 is not fixed. When the width of the groove 170 is too narrower than the thickness of the vibrating plate 320, it is difficult to smoothly operate while the vibrating plate 320 is being inserted. Accordingly, the width of the groove 170 may be determined considering the thickness of the vibrating plate 320 to allow the vibrating plate 320 to be easily inserted and to allow the vibrating plate 320 to be firmly fixed. Also, since a side of the vibrating plate 320 adjoining the plane 110 of the lower and upper cases 100 and 200 is not allowed to be in contact with the plane 110, the groove 170 may be formed not to allow the plate 110 to be perfectly exposed. On the other hand, since the upper case 200 may be manufactured to have the same shape as the lower case 100, an end of the vibrating plate 320 is inserted into and fixed to the groove 170 of the lower and upper cases 100 and 200 and the weight member 400 and the piezoelectric element 310 are separate from the lower and upper cases 100 and 200 with certain intervals. Herein, the single steps 160 of the lower and upper cases 100 and 200 have a magnetic force, and the projecting portions 440 of the weight member 400 inserted between the single steps 160 also have a magnetic force. Herein, the magnetic force of the single step 160 and the magnetic force of the projecting portion 440 may have the same polarity, thereby generating a repulsive force. Accordingly, the projecting portion 440 of the weight member 400 may be provided with a certain interval between the single steps 160 of the lower and upper cases 100 and 200. As described above, since the projecting portion 440 of the weight member 400 is kept by the repulsive force in a space formed by the single steps 160 of the lower and upper cases 100 and 200, the weight member 400 may not be in contact with the lower and upper cases 100 and 200 and may be separate with a certain interval. On the other hand, between the single steps 160 of the lower and upper cases 100 and 200 and the projecting portion 440 of the weight member 400, a material having excellent wear-resistance, lubricative properties, and mechanical strength such as Teflon, poly oxy methylene (POM), and acetal may be provided. That is, the single steps 160 and the projecting portion 440 may be kept by the magnetic forces or by a material having less frictional force therebetween. In this case, the weight member 400 is not in direct contact with the lower and upper cases 100 and 200.

The piezoelectric vibrating member 300 includes the piezoelectric element 310 and the vibrating plate 320 attached to one side of the piezoelectric element 310. In the piezoelectric vibrating member 300, one side of the vibrating plate 320 is adhered to the one side of the piezoelectric element 310 and another side of the vibrating plate 320 is coupled with a part of the weight member 400. Also, the piezoelectric vibrating member 300 is provided in the lower and upper cases 100 and 200 to allow the one side and the other side to head for the sides 120 of the lower and upper cases 100 and 200. Herein, an end of the vibrating plate 320 is inserted into the groove 170 of the lower and upper cases 100 and 200 while sides of the vibrating plate 320 are not in contact with the plane 110 of the lower and upper cases 100 and 200. That is, only the end of the vibrating plate 320 is fixed to the lower and upper cases 100 and 200 and other portions, that is, the sides of the vibrating plate 320, the piezoelectric element 310, and the weight member 400 are not in direct contact with the lower and upper cases 100 and 200. The weight member 400 has an approximate hexahedral shape having a certain length, width, and thickness. Herein, two sides opposite to each other in a thickness direction may be broader than two sides opposite to each other in a lateral direction. Also, the weight member 400 is formed with a contact portion 410 toward the piezoelectric vibrating member 300 and the contact portion 410 is in contact with the piezoelectric vibrating member 300. On the other hand, the weight member 400 is formed with the projecting portions 440 on both ends in a longitudinal direction. The projecting portion 440 is formed to be thinner than a body, for example, may be formed to have a thickness of ½ of a thickness of the body. Also, a length of the weight member 400 between the projecting portions 440 on both ends thereof may be the same as a length of the vibrating plate 320 of the piezoelectric vibrating member 300. The projecting portion 440 of the weight member 400 is inserted into the single steps 160 of the lower and upper cases 100 and 200 not to be in contact therewith. Herein, at least the projecting portions 440 of the weight member 400 have the magnetic force having the same polarity as the magnetic force of the single steps 160, thereby keeping a certain interval between the projecting portions 440 and the single steps 160 due to the repulsive force between the single steps 160 and the projecting portions 440. Also, the projecting portions 440 and the weight member 400 are provided not to allow other portions to be in contact with the lower and upper cases 100 and 200.

The limitation member 500A may project from at least one of the lower and upper cases 100 and 200. That is, the limitation member 500A may project from one of the lower case 100 and the upper case 200 or may project from the same areas of the lower and upper cases 100 and 200 to be in contact with one other. The limitation member 500A may penetrate the lower and upper cases 100 and 200. For example, the limitation member 500A may be inserted from the lower case 100 to the upper case 200. The limitation member 500A may be provided between the weight member 400 and the piezoelectric vibrating member 300. For example, the limitation member 500A may project from the planes 110 of the lower and upper cases 100 and 200 with a certain height and may be provided between the weight member 400 and the piezoelectric vibrating member 300. Herein, the limitation member 500A may be separate from the contact portion 410 of the weight member 400 and may be provided adjacently to ends of the weight member 400 and the piezoelectric vibrating member 300. Also, the limitation member 500A may keep a certain interval with the weight member 400 according to a preset movement range of the weight member 400. As described above, since the limitation member 500A projects from the lower and upper cases 100 and 200 and is provided between the weight member 400 and the piezoelectric vibrating member 300, excessive movement of the weight member 400 may be limited, thereby preventing damages of the piezoelectric vibrating member 300 occurring due to the weight member 400.

On the other hand, in the case of a piezoelectric vibrating device, in which the piezoelectric vibrating member 300 vibrates in a horizontal direction and the weight member 400 is in contact with the piezoelectric vibrating member 300 in a horizontal direction, the limitation member 500 having a pin shape may be provided to be inserted into from the lower case 100 to the upper case 200 through the weight member 400. Herein, the limitation member 500 may be in contact with and fixed to holes of the lower and upper cases 100 and 200 and a hole greater than a thickness of the limitation member 500 is formed in the weight member 400 to allow the limitation member 500 to be inserted therein. The hole of the weight member 400 and the thickness of the limitation member 500 may be formed to have sizes corresponding to the preset movement range of the weight member 400.

According to the embodiments of the present disclosure, a piezoelectric vibrating device is provided with a limitation member for limiting a movement range of a weight member between a piezoelectric vibrating member and the weight member. The limitation member may be provided to penetrate and be inserted into a lower case, the piezoelectric vibrating member, and the weight member or may be provided by modifying a structure of the piezoelectric vibrating device.

Accordingly, although external impact is applied, since it is possible to limit the movement of the weight member by the limitation member, a damage of the piezoelectric vibrating member occurring due to a hit of the weight member, thereby improving durability of the piezoelectric vibrating device.

Although the piezoelectric vibrating device has been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A piezoelectric vibrating device comprising:
a case provided with a certain space therein;
a piezoelectric vibrating member provided in the case and vibrating according to an applied voltage;
a weight member provided in the case and connected to a part of the piezoelectric vibrating member in a vibration direction of the piezoelectric vibrating member; and
a limitation member for limiting movement of the weight member,
wherein the case, the piezoelectric vibrating member, and the weight member are formed with holes at certain areas, respectively, and the limitation member is inserted through the holes.

2. The device of claim 1, wherein the piezoelectric vibrating member comprises a piezoelectric element and a vibrating plate, and the piezoelectric element is fixed to one of a top and a bottom of the vibrating plate.

3. The device of claim 2, wherein the vibrating plate is provided to be flat, to be bent at least once at an edge, or to be formed with a wrinkle at the edge.

4. The device of claim 1, wherein the limitation member comprises a first area inserted into the hole of the weight member and the hole of an upper case and a second area inserted into the hole of the piezoelectric vibrating member and the hole of a lower case and the second area is thicker than the first area.

5. The device of claim 4, wherein the weight member and the piezoelectric vibrating member are not in contact with the limitation member and the lower and upper cases are in contact with the limitation member.

6. The device of claim 5, wherein a part of the second area of the limitation member is provided between the weight member and the piezoelectric vibrating member and limits the movement of the weight member.

7. A piezoelectric vibrating device comprising:
a case provided with a certain space therein;
a piezoelectric vibrating member provided in the case and configured to vibrate according to an applied voltage;
a weight member provided in the case and connected to a part of the piezoelectric vibrating member in a vibration direction of the piezoelectric vibrating member; and
a limitation member for limiting movement of the weight member,
wherein the limitation member comprises:
projecting portions provided on two opposite sides of the weight member, respectively; and
openings formed in sides of an upper case corresponding to the projecting portions to allow the projecting portions to be inserted therein, respectively.

8. A piezoelectric vibrating device comprising:
a case provided with a certain space therein;
a piezoelectric vibrating member provided in the case and configured to vibrate according to an applied voltage;
a weight member provided in the case and connected to a part of the piezoelectric vibrating member in a vibration direction of the piezoelectric vibrating member; and
a limitation member for limiting movement of the weight member, wherein the limitation member comprises:
projecting portions provided on two opposite sides of the weight member, respectively; and
guides formed on inner sides of an upper case corresponding to the projecting portions to allow the projecting portions to be inserted therein, respectively.

9. The device of claim 1, wherein the weight member and the piezoelectric vibrating member are not in contact with the limitation member and the case is in contact with the limitation member.

10. The device of claim 1, wherein a part of the limitation member is provided between the weight member and the piezoelectric vibrating member and limits the movement of the weight member.

* * * * *